(12) United States Patent
Zori et al.

(10) Patent No.: US 10,437,941 B1
(45) Date of Patent: Oct. 8, 2019

(54) SYSTEMS AND METHODS FOR MODELING FLUID FLOW IN TURBOMACHINES

(71) Applicant: Ansys, Inc., Canonsburg, PA (US)

(72) Inventors: Laith Zori, Clifton, VA (US); Paul Galpin, Kitchener (CA); Rubens Campregher, Waterloo (CA); Phillipe Godin, Waterloo (CA); Juan Carlos Morales, Waterloo (CA)

(73) Assignee: Ansys, Inc., Canonsburg, PA (US)

( * ) Notice: Subject to any disclaimer, the term of this patent is extended or adjusted under 35 U.S.C. 154(b) by 539 days.

(21) Appl. No.: 14/823,413

(22) Filed: Aug. 11, 2015

Related U.S. Application Data (60) Provisional application No. 62/045,895, filed on Sep. 4, 2014.

(51) Int. Cl.
   *G06F 17/50* (2006.01)
   *F01D 21/00* (2006.01)
   *F01D 5/02* (2006.01)

(52) U.S. Cl.
   CPC .......... *G06F 17/5009* (2013.01); *F01D 5/02* (2013.01); *F01D 21/003* (2013.01)

(58) Field of Classification Search
   CPC ...... G06F 17/5009; G06F 17/10; G06F 17/50; F01D 21/003; F01D 5/02
   USPC ............................................................ 703/2
   See application file for complete search history.

(56) References Cited

U.S. PATENT DOCUMENTS 6,004,095 A * 12/1999 Waitz ................... B64C 21/025
                                                          415/115

OTHER PUBLICATIONS

Gourdain, et al. "Application of Large-Eddy simulation to rotor/stator configurations." 21ème Congrès Français de Mécanique, 26 au 30 août 2013, Bordeaux, France (FR) (2013). pp. 1-6.*
Rai, Manmohan. "Navier-Stokes simulations of rotor/stator interaction using patched and overlaid grids." Journal of Propulsion and Power 3.5 (1987). pp. 387-396.*
Ben, Z. H. A. O., et al. "Unsteady flow variability driven by rotor-stator interaction at rotor exit." Chinese Journal of Aeronautics 25.6 (2012). pp. 871-878.*

* cited by examiner

*Primary Examiner* — Kamini S Shah
*Assistant Examiner* — John E Johansen
(74) *Attorney, Agent, or Firm* — Jones Day (57) ABSTRACT

Systems and methods are provided for modeling fluid flow in a turbomachine. A specification of a system is received. The system includes multiple passages, where the multiple passages include at least an inlet guide vane, a rotor, and a stator. A computational grid is generated with a processing system based on the received specification. Governing flow equations for the system are transformed based on inclination parameters, where each passage of the system has an associated inclination parameter. A rotational velocity of rotating passages included in the system is specified, and a time-step for stationary passages included in the system is specified. Time-steps for the rotating passages included in the system are computed, where the time-steps are computed based on pitch-ratios for adjacent passages of the system. A solution for the system is advanced in time by solving the transformed governing flow equations across the computational grid using computer-based numerical calculations.

20 Claims, 8 Drawing Sheets

SYSTEMS AND METHODS FOR MODELING FLUID FLOW IN TURBOMACHINES

CROSS-REFERENCE TO RELATED APPLICATIONS

This application claims priority to U.S. Provisional Patent Application No. 62/045,895, filed Sep. 4, 2014, entitled "Systems and Methods for Modeling Fluid Flow in Turbomachines," which is incorporated herein by reference in its entirety.

FIELD

This disclosure is related generally to computer-aided design and more particularly to systems and methods for modeling fluid flow between rows of blades in a turbomachine.

BACKGROUND

A turbomachine is a device in which energy is transferred either to, or from, a continuously flowing fluid by the dynamic action of one or more moving blade rows. The one or more moving blade rows of a turbomachine are commonly used to compress or expand a fluid. For example, a compressor for a gas turbine engine may include several rows of rotor blades and stator blades that progressively compress a fluid to high pressures. Computational fluid dynamics (CFD) software is used to simulate and display the flow of fluid between stages of a turbomachine. In general, modern CFD software provides the ability to simulate and display flows of gases and liquids through physical systems using computer-based numerical calculations.

SUMMARY

Systems, methods, and non-transitory computer-readable storage mediums are provided for modeling fluid flow between rows of blades in a turbomachine. In an example computer-implemented method for modeling fluid flow between rows of blades in a turbomachine, a specification of a system is received. The system includes multiple passages, where the multiple passages include at least an inlet guide vane, a rotor, and a stator. A computational grid is generated with a processing system based on the received specification. Governing flow equations for the system are transformed based on inclination parameters, where each passage of the system has an associated inclination parameter. A rotational velocity of rotating passages included in the system is specified, and a time-step for stationary passages included in the system is specified. Time-steps for the rotating passages included in the system are computed, where the time-steps for the rotating passages are computed based on pitch-ratios for adjacent passages of the system. A solution for the system is advanced in time by solving the transformed governing flow equations across the computational grid using computer-based numerical calculations. The transformed governing equations are iteratively solved at discrete time steps defined by the time steps for the stationary passages and the rotating passages.

An example computer-implemented system for modeling fluid flow between rows of blades in a turbomachine includes a processing system and a memory in communication with the processing system. The processing system is configured to execute steps. In executing the steps, a specification of a system is received. The system includes multiple passages, where the multiple passages include at least an inlet guide vane, a rotor, and a stator. A computational grid is generated based on the received specification. Governing flow equations for the system are transformed based on inclination parameters, where each passage of the system has an associated inclination parameter. A rotational velocity of rotating passages included in the system is specified, and a time-step for stationary passages included in the system is specified. Time-steps for the rotating passages included in the system are computed, where the time-steps for the rotating passages are computed based on pitch-ratios for adjacent passages of the system. A solution for the system is advanced in time by solving the transformed governing flow equations across the computational grid using computer-based numerical calculations. The transformed governing equations are iteratively solved at discrete time steps defined by the time steps for the stationary passages and the rotating passages.

An example non-transitory computer-readable storage medium for modeling fluid flow between rows of blades in a turbomachine includes computer-executable instructions which, when executed, cause a processing system to execute steps. In executing the steps, a specification of a system is received. The system includes multiple passages, where the multiple passages include at least an inlet guide vane, a rotor, and a stator. A computational grid is generated based on the received specification. Governing flow equations for the system are transformed based on inclination parameters, where each passage of the system has an associated inclination parameter. A rotational velocity of rotating passages included in the system is specified, and a time-step for stationary passages included in the system is specified. Time-steps for the rotating passages included in the system are computed, where the time-steps for the rotating passages are computed based on pitch-ratios for adjacent passages of the system. A solution for the system is advanced in time by solving the transformed governing flow equations across the computational grid using computer-based numerical calculations. The transformed governing equations are iteratively solved at discrete time steps defined by the time steps for the stationary passages and the rotating passages.

DETAILED DESCRIPTION

Figure 1:
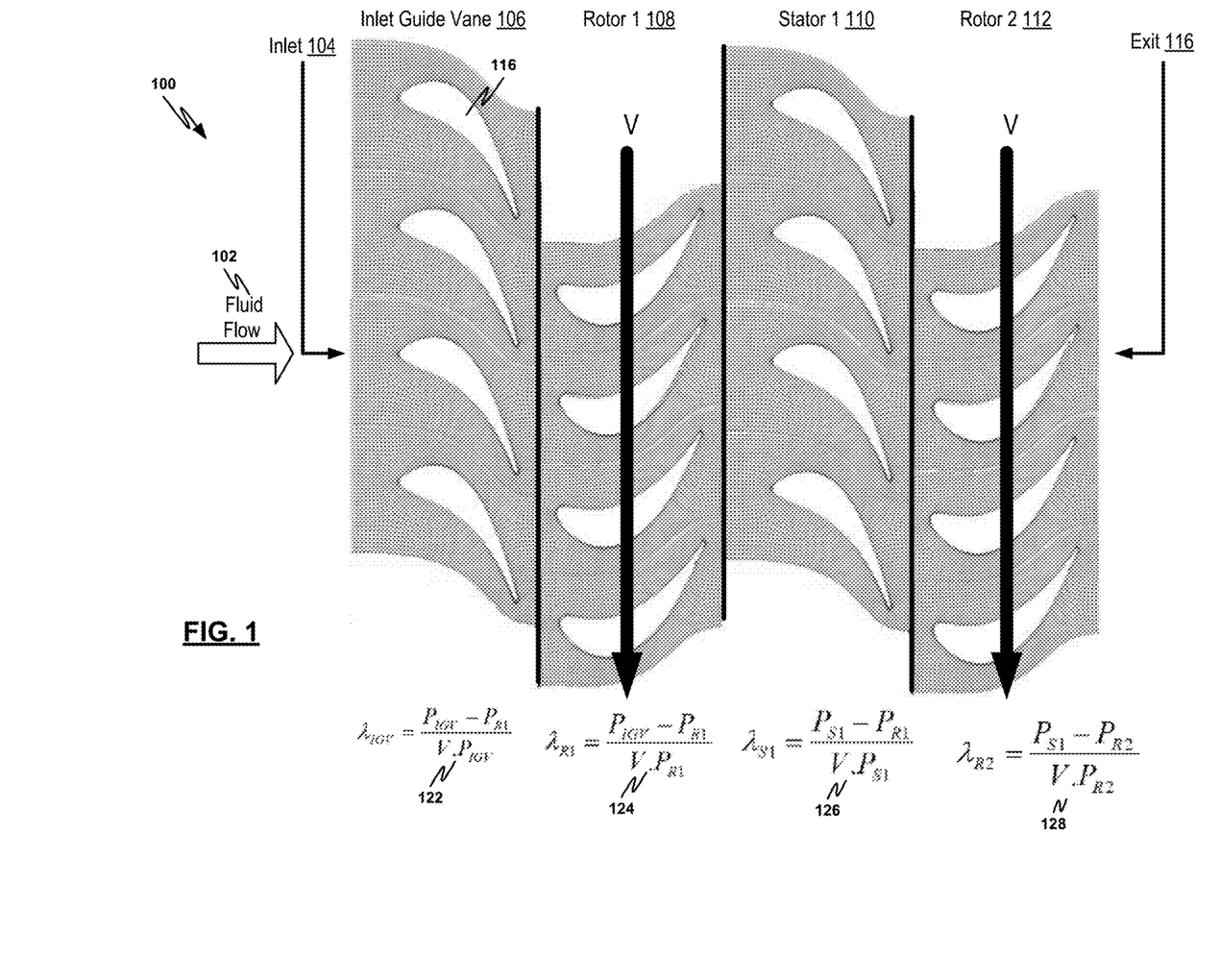
FIG. 1 depicts an example system including a plurality of rows of blades.

FIG. 1 depicts an example system 100 including a plurality of rows of blades. The system 100 may comprise a portion of a turbine or a compressor, for example. As illustrated in FIG. 1, the system 100 includes an inlet guide vane 106, a first rotor 108, a stator 110, and a second rotor 112. Such a system including the components 106, 108, 110, 112 comprises a portion of a two-stage turbomachine, where each of the components 106, 108, 110, 112 constitutes one-half of a stage (i.e., a single-stage turbomachine includes only an inlet guide vane and a rotor and does not include additional rotors or stators). Each of the inlet guide vane 106, the first rotor 108, the stator 110, and the second rotor 112 include a row of blades 116. In the first and second rotors 108, 112, the blades are connected to a hub, allowing these blades to rotate at a circumferential velocity of V. The circumferential velocity V referred to herein may also be known as a rotational velocity or a rotor blade velocity. By contrast, the blades of the inlet guide vane 106 and stator 110 are stationary and do not move. The system 100 further includes an inlet 104 and an outlet 114. As illustrated in FIG. 1, a flow of fluid 102 enters the system 100 via the inlet 104 and exits the system via the outlet 114.

The system 100 represents a physical system or structure to be analyzed via a computer-aided simulation (e.g., a computational fluid dynamics (CFD) simulation). For example, the system 100 may be analyzed to model fluid flow interactions between the rows of blades of the inlet guide vane 106, the first rotor 108, the stator 110, and the second rotor 112. Specifically, the system 100 may be analyzed via the time-resolved numerical method described herein to model any identifiable flow feature interacting between the blade rows of the system 100, where such flow features may include wakes (e.g., trailing edge wake flows passing between the inlet guide vane 106, the first rotor 108, the stator 110, and the second rotor 112), shocks, pressure variations, velocity profiles, and separated flow regions, among others. In the analysis, the system 100 may be considered to have characteristics of a single- or multiple-stage axial, radial, or mixed flow turbomachine, for example.

In modeling multistage systems such as the system 100 of FIG. 1, single-sided time-transformation interfaces (described in greater detail below) are used as part of a transient blade row analysis method. The transient blade row analysis method may allow for better capturing of the complex inter-blade physics between rotor and stator rows of compressor and turbine stages as compared to standard steady-state methods based on mixing procedures. Since the number of blades in turbomachines may vary from one row to another (e.g., due to aeromechanical considerations), previous approaches have used a full-domain modeling approach, where the entire turbomachine geometry is modeled. Full-domain modeling is computationally expensive both in computer processing and memory requirements and may not be practical. To avoid the use of such full-domain modeling, the systems and methods described herein are used in conjunction with a pitch change model. The pitch change model is used to model multistage systems using a reduced geometry (e.g., a single passage or a few passages per row), thus reducing the overall computational resource requirements.

The use of the pitch change model, as described herein, improves the functioning of a computer system as compared to the full-domain modeling approach, because the pitch change model enables the modeling of systems to be carried out (i) more efficiently (e.g., faster), (ii) with a reduced processing burden, and (iii) with reduced memory requirements, as compared to the full-domain modeling approach. For example, modeling a 1.5 stage turbomachine via the full-domain modeling approach may require modeling a system with 300 blade passages (e.g., the system may include 100 blade passages in an inlet guide vane row, 100 blade passages in a rotor row, and 100 blade passages in a stator row, all of which are modeled in the full-domain modeling approach). By contrast, using the pitch change model employed herein, the 1.5 stage turbomachine may be modeled with only 3 blade passages, in an example. Reducing the problem from 300 blade passages to 3 blade passages, the approaches described herein permit the modeling to be carried out 100 times faster than the full-domain modeling approach. Further, use of the full-domain modeling approach would require 100 times more memory than is required when using the pitch change model, in this example. It is further noted that the techniques described herein improve the functioning of the computer system without sacrificing accuracy in the modeling.

It should be understood that the case described above (i.e., involving the reduction of the problem from 300 blade passages to 3 blade passages) is merely an example. In other examples, the number of blade passages per row is a different number (e.g., 97 blades, 77 blades, 23 blades, etc.). In general, the increase in speed, reduction of processing burden, and reduction of memory requirements enabled by the systems and methods described herein is dependent on the ratio between (i) the number of blade passages modeled in the full-domain modeling approach and (ii) the number blade passages modeled in the pitch change model approach utilized herein. Thus, in the example described above, the ratio between the 300 blade passages modeled in the full-domain modeling approach and the 3 blade passages modeled in the pitch change model approach permits the modeling to be carried out 100 times faster (i.e., 300/3=100). In other examples where the number of blade passages per row is a different number, this ratio is different, and thus, the amount by which the pitch change model approach increases the efficiency of modeling is equal to a number that is different from 100.

The aforementioned transient blade row analysis and the pitch change model are described in (1) "Unsteady CFD Methods In a Commercial Solver for Turbomachinery Applications," Thomas Bieseinger et al., GT2010-22762 ASME Turbo Expo, June 2010, Glasgow, UK, and (2) "Investigation of Transient CFD Methods Applied to a Transonic Compressor Stage," Rob Blumenthal, et al., GT2011-46635 ASME Turbo Expo, June 2011, Vancouver, Canada, which are incorporated herein by reference in their entireties.

It should be understood that the two-stage system illustrated in FIG. 1 is exemplary only, and that in other examples, a system to be analyzed via the computer-aided simulation includes fewer stages or additional stages. It should also be understood that the illustration of FIG. 1 is a simplified representation of the system 100 to be analyzed (e.g., the system 100 to be analyzed includes more than four blades in each row of blades, and rows of blades of the system 100 to be analyzed may have numbers of blades that vary from one row to another, etc.).

In analyzing the system 100, a specification of the system 100 is received or generated. The specification of the system 100 having the inlet guide vane 106, the first rotor 108, the stator 110, and the second rotor 112 may include positioning data (i.e., placement data) that defines a positioning of the components 106, 108, 110, 112 in relation to each other and in relation to other aspects (e.g., boundaries, etc.) of the system 100. The specification of the system 100 may further include geometric data comprising geometrical attributes for each of the components 106, 108, 110, 112. In an example, the geometric data includes, for example, the shape of the blades' surfaces, number of blades per row, the number of stages, and sizes of the various components included in the system. The positioning data and/or geometric data may comprise various other data defining characteristics of the inlet 104 and the outlet 106 and couplings between the components 104, 106, 108, 110, 112, 116.

In an example, the specification for the system 100 may describe the geometry and/or positioning data of the system 100 as a set of surface triangles for each of the components 104, 106, 108, 110, 112, 116. In other examples, the geometry and/or positioning data may be described using an industry standard definition (e.g., IGES, STEP, or STL), a proprietary format (e.g., ACIS, CATIA, and SDRC), or another format. Aspects of the system 100 and the geometry thereof can also be specified using mechanical CAD (MCAD) system databases, for example. It should be understood that the formats and databases listed here are examples only. Thus, the geometry and/or positioning data may be specified in any number of different formats, and the acceptable formats are not limited to those listed above. It should also be understood that the illustration of FIG. 1 may not be representative of the geometry and/or positioning data included in the specification. For example, the components 104, 106, 108, 110, 112, 116 in the illustration of FIG. 1 may not be arranged based on the positioning data included in the specification. Further, although components are depicted in the illustration of FIG. 1 as being two-dimensional objects, it should be understood that the system 100 to be analyzed may include three-dimensional objects. For such three-dimensional objects, the specification includes data defining the size and shape of the components in three dimensions.

Figure 2:
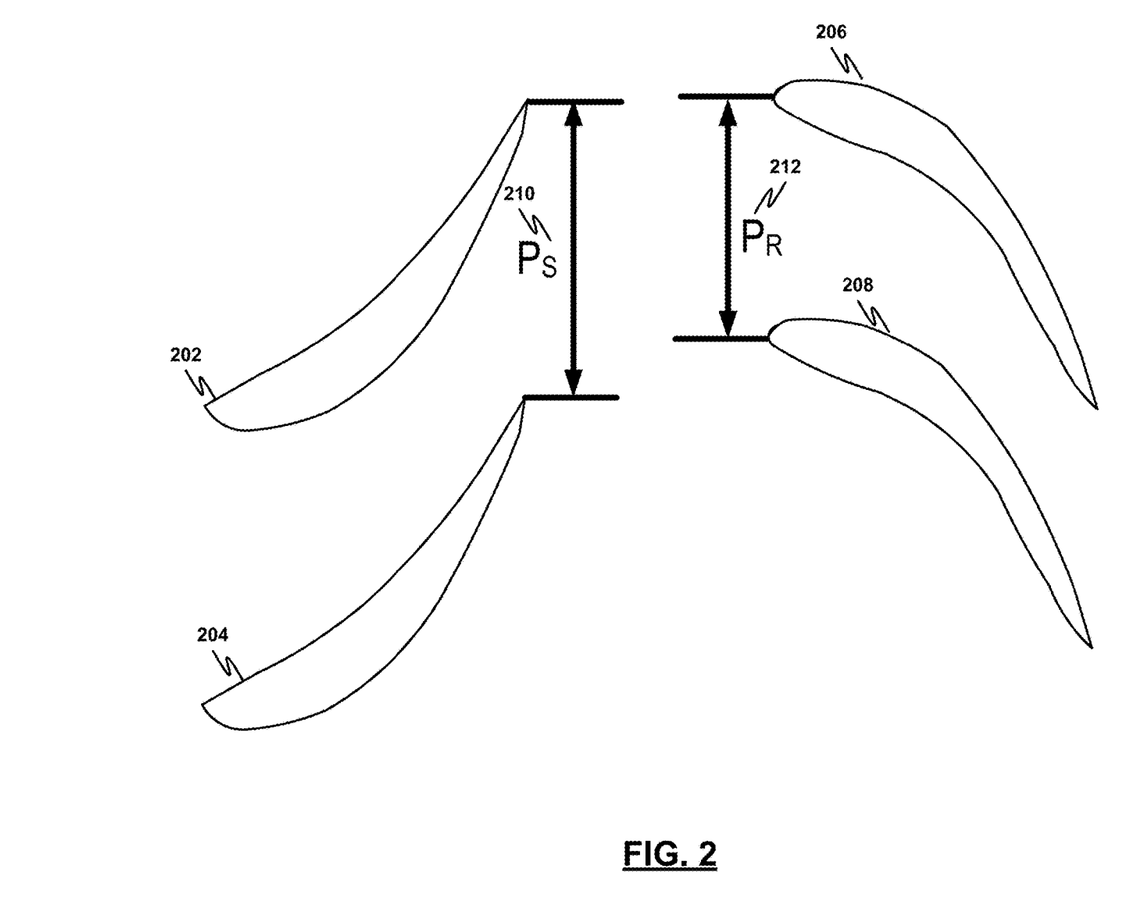
FIG. 2 depicts blades of a stator and blades of a rotor.

Pitch values for the components 106, 108, 110, 112 are calculated from the geometry data included in the specification for the system 100. The calculated pitch values include values $P_{IGV}$, $P_{R1}$, $P_{S1}$, and $P_{R2}$ that are associated with the inlet guide vane 106, the first rotor 108, the stator 110, and the second rotor 112, respectively. Each of the pitch values specifies a pitch between adjacent blades of the associated inlet guide vane, rotor, or stator. For example, FIG. 2 illustrates blades 202, 204 of a stator and blades 206, 208 of a rotor. As illustrated in FIG. 2, a pitch value $P_S$ 210 for the stator specifies a distance between adjacent blades of the stator, and a pitch value $P_R$ 212 specifies a distance between adjacent blades of the rotor.

The received specification may include other parameters describing features of the system 100 to be analyzed. For example, all necessary boundary conditions to define the fluid flow in the system 100 may be included in the specification. The boundary conditions may include inlet and outlet boundary specifications such as pressure, temperature, and flow angles, among others. The specification may further include the value V specifying the rotational velocity of the first and second rotors 108, 112. Various other parameters may be included in the specification of the system 100 to be analyzed (e.g., physical and material attributes for each of the components, boundary conditions for the system to be analyzed, momentum values, back pressure of one or more of the airfoils included in the system, etc.). It should be understood that the parameters listed herein as being included in the specification may not be an exhaustive list, and that various other parameters may be included in the received specification for performing the analysis of the system 100.

In analyzing the system 100, a computational grid is generated based on the received specification and/or additional other parameters. Broadly, analysis of the system 100 is performed using computer-based CFD methods, which allows a continuous problem domain to be replaced with a discrete domain using the computational grid. For example, in the continuous problem domain, each flow variable to be solved in the system 100 is defined at every point in the domain. By contrast, in the discrete domain, each flow variable is defined only at discrete grid points of the computational grid. In the computer-based CFD method, analyzing the system 100 includes solving for the relevant flow variables only at the grid points of the computational grid, with values at other locations being determined by interpolating the values at the grid points. The computational grid may be composed, for example, of quadrilateral cells, triangular cells, or cells of another type (e.g., hexahedrals, tetrahedral, prisms, etc.), and the aforementioned grid points (i.e., nodes).

The computational grid generated for analyzing the system 100 may include a number of different portions. Specifically, the computational grid may include a first portion associated with the inlet guide vane 106, a second portion associated with the first rotor 108, a third portion associated with the stator 110, and a fourth portion associated with the second rotor 112. It should be understood that the computational grid may include additional other portions in addition to the first, second, third, and fourth grid portions described herein. In the analysis of the system 100, the first and third portions of the computational grid are fixed to the blade rows of the inlet guide vane 106 and the stator 110, respectively, while the second and fourth portions of the computational grid are moving with the blade rows of the first and second rotors 108, 112, respectively, at the velocity value of V.

To analyze the system 100 and model the flow of fluid through the system 100, flow equations are solved across the computational grid using computer-based numerical simulations. The solving of the flow equations across the computational grid includes approximating the governing equations for a fluid (e.g., partial differential equations defined in terms of continuous variables for momentum, velocity, etc.) in the discrete domain. Thus, discrete equations are solved across the computational grid using the computer-based numerical simulations.

In the example of FIG. 1, governing flow equations for the system 100 are transformed based on inclination parameters. Specifically, governing flow equations in the inlet guide vane 106 are transformed using an inclination parameter $\lambda_{IGV}$ 122 illustrated in FIG. 1. The transformation of governing flow equations based on inclination parameters is described in further detail in "Stator/Rotor Interaction in a Transonic Turbine," Michael B. Giles, Journal of Propulsion Vol. 6, No. 5, 1990, pp. 621-627 (referred to herein as "Giles article"), which is incorporated herein by reference in its entirety. The governing flow equations transformed based on the inclination parameters may be, for example, Euler or Navier-Stokes equations. As illustrated in FIG. 1, the parameter $\lambda_{IGV}$ 122 is based on a difference between $P_{IGV}$ and $P_{R1}$:

$$\lambda_{IGV} = \frac{P_{IGV} - P_{R1}}{VP_{IGV}}. \quad \text{(Equation 1)}$$

In a similar manner, governing flow equations in the rotor 108 are transformed using an inclination parameter $\lambda_1$ 124 illustrated in FIG. 1. The parameter $\lambda_1$ is a second inclination parameter used in transforming the governing flow equations and is based on a difference between $P_{IGV}$ and $P_{R1}$:

$$\lambda_{R1} = \frac{P_{IGV} - P_{R1}}{VP_{R1}}. \quad \text{(Equation 2)}$$

As described in further detail below with reference to FIG. 3, Equations 1 and 2 are used in implementing a conventional time-transformation (TT) method (also known as a time-inclining method) that can be used in modeling single-stage turbomachinery geometry, where the single stage system has a pitch-change between the inlet guide vane and the rotor. Aspects of the conventional time-transformation method are described in further detail in Bieseinger et al., Blumenthal, et al., and the Giles article, cited above. The conventional time-transformation method is restricted to modeling single-stage turbomachinery and cannot be used in modeling systems having more than one stage.

The systems and methods described herein extend the conventional time-transformation method to facilitate analysis and modeling of turbomachines having more than one stage. As described in greater detail below with reference to FIGS. 4-8, the systems and methods described herein utilize single-sided time-transformation interfaces to model various features of a multistage turbomachine (e.g., to analyze inter-blade interaction, capture the trailing edge wake from upstream rows to downstream rows, model any identifiable flow feature interacting between blade rows in the turbomachine, etc.). The single-sided time-transformation interface facilitates the attachment of additional rows to the conventional time-transformation model while accurately accounting for the blade passing signals from upstream blade rows to downstream blade rows. These interfaces are used in the context of transient rotor-stator (TRS) simulations that allow flow features to be modeled while requiring only a single or few blade passages per row (e.g., via use of the pitch change model described above). In modeling multistage turbomachines, the interfaces are said to be "single-sided" because the interface transforms the governing flow equations in the passage attached at the downstream side of the interface, and the interface does not transform the governing flow equations in the passage that is attached at the upstream side of the interface. The use of the single-sided time-transformation interfaces and the pitch change model, as described herein, improves the functioning of a computer system as compared to previous approaches, because the techniques utilized herein enable the modeling of systems to be carried out (i) more efficiently (e.g., faster), (ii) with a reduced processing burden, and (iii) with reduced memory requirements, as compared to the previous approaches. It is further noted that the techniques described herein improve the functioning of the computer system without sacrificing accuracy in the modeling.

The single-sided nature of the interface is illustrated with reference again to FIG. 1. In modeling the system 100 of FIG. 1, a first single-sided time-transformation interface is placed between first rotor 108 and the stator 110. Based on the first single-sided time-transformation interface, the flow equations in the stator 110 are transformed using the inclination parameter $\lambda_{S1}$ 126. This inclination parameter as illustrated in FIG. 1 is based on the rotational velocity V and the pitch difference between $P_{S1}$ and $P_{R1}$. The parameter $\lambda_{S1}$ 126 is defined as:

$$\lambda_{S1} = \frac{P_{S1} - P_{R1}}{VP_{S1}}. \quad \text{(Equation 3)}$$

The governing flow equations in the rotor 108 that is attached to an upstream side of the single-sided time-transformation interface are not transformed based on this interface.

In a similar manner, a second single-sided time-transformation interface is placed between the stator 110 and the second rotor 112. Based on the second single-sided time-transformation interface, the flow equations in the second rotor 112 are transformed using the inclination parameter $\lambda_{R2}$ 128. This inclination parameter as illustrated in FIG. 1 is based on the rotational velocity V and the pitch difference between $P_{S1}$ and $P_{R2}$. The parameter $\lambda_{R2}$ 128 is defined as:

$$\lambda_{R2} = \frac{P_{S1} - P_{R2}}{VP_{R2}}. \quad \text{(Equation 4)}$$

The governing flow equations in the stator 110 that is attached to an upstream side of the second single-sided time-transformation interface are not transformed based on this interface. A solution for the system 100 is advanced in time by solving the transformed governing flow equations across the computational grid using the aforementioned computer-based numerical calculations. Although the system 100 of FIG. 1 is depicted as including two stages, it should be understood that a system to be analyzed in accordance with the systems and methods described herein may be of a higher complexity and may include more than two stages.

Figure 3:
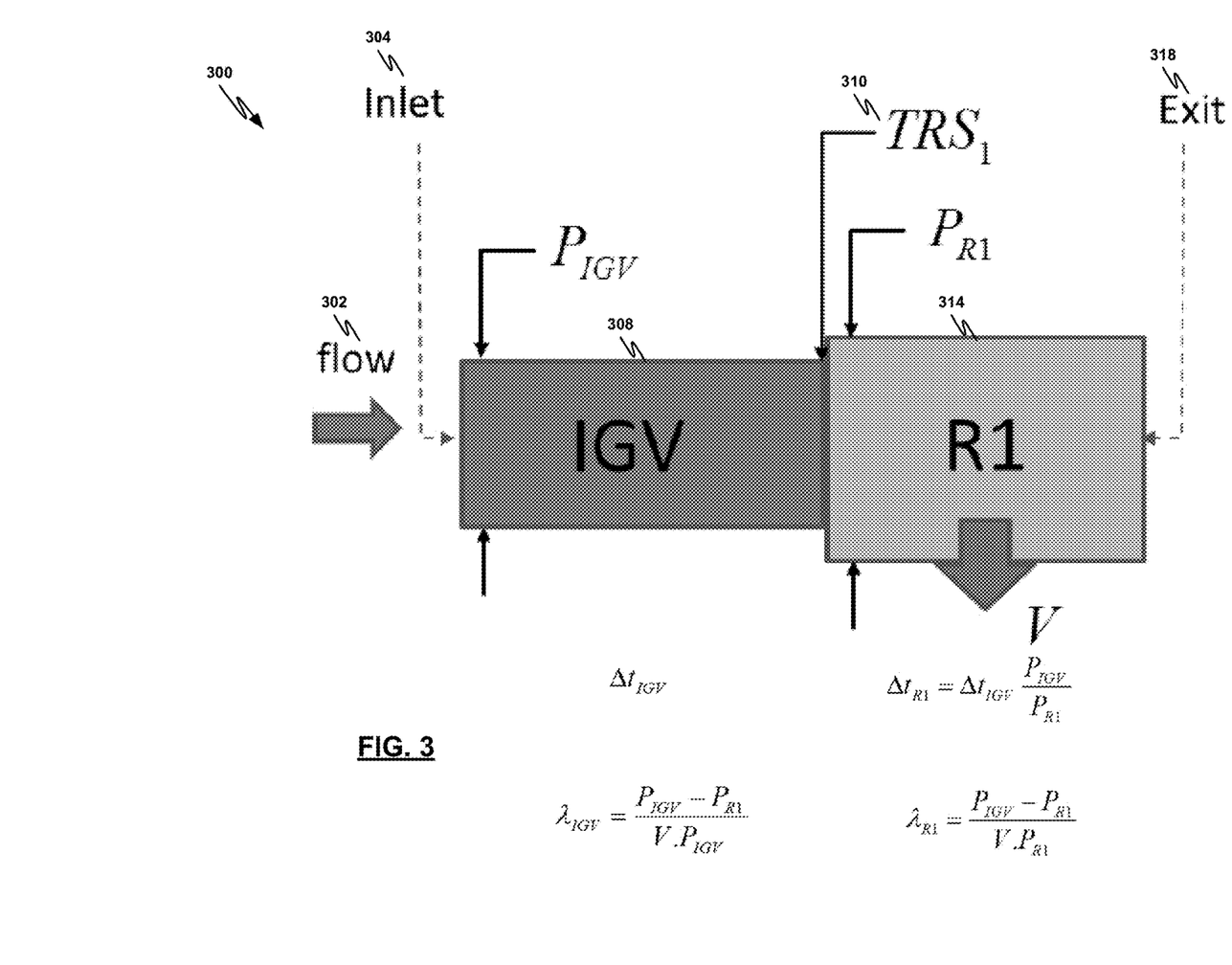
FIG. 3 is a block diagram depicting a single-stage turbomachine including an inlet guide vane and a rotor.

FIG. 3 is a block diagram 300 depicting a single-stage turbomachine including an inlet guide vane 308 and a rotor 314. The block diagram 300 illustrates features of a physical system or structure to be analyzed via a computer-aided simulation, where the simulation is used to model various flow features of the system. As depicted in FIG. 3, the system to be analyzed further includes an inlet 304 and an outlet 318, where a flow of fluid 302 enters the system via the inlet 304 and convects downstream, exiting the system via the outlet 318. In analyzing the system of FIG. 3, a specification of the system is received and/or generated. As described above with reference to FIG. 1, the specification may include, among other items, geometrical attributes of the system and parameters defining aspects of the fluid entering the system. Using the geometrical attributes of the specification, a pitch value $P_{IGV}$ for the inlet guide vane 308 and a pitch value $P_{R1}$ for the rotor 314 are calculated. A velocity value V representing the rate of rotation of the rotor 314 is specified.

The single-stage system of FIG. 3 is analyzed using a conventional time-transformation method. In the time-transformation method, governing flow equations (e.g., Euler or Navier-Stokes equations) are transformed in time such that the phase-shifted flow problem becomes instantaneously periodic in computational transformed time (i.e., inclined time). The transformation in time obviates the need for any special numerical treatment on pitchwise boundaries. In implementing the conventional time-transformation method, a computational grid is generated based on the received specification. In examples where a 2D system is analyzed, the computational grid may be defined based on physical coordinates that include spatial coordinates x and y and temporal coordinate t, where the physical coordinates are transformed to a set of computational coordinates x', y', t' as follows:

$$x' = x;$$

$$y'=Y;$$

$$t'=t-\lambda y. \quad \text{(Equation 5)}$$

Although Equation 5 illustrates transformation of physical coordinates for a 2D system, physical coordinates x, y, z, and t for a 3D system are transformed in a similar manner. Such transformations for a 3D system are known to those of ordinary skill in the art.

In Equation 5, the variable λ is an inclination parameter (e.g., similar to the inclination parameters described above with reference to FIG. 1) used in the transformation of the governing flow equations. Each of the inlet guide vane 308 and the rotor 314 has its own inclination parameter, with the inclination parameter $\lambda_{IGV}$ for the inlet guide vane 308 being defined by Equation 1, and the inclination parameter $\lambda_{R1}$ for the rotor being defined by Equation 2. Thus, flow equations in the inlet guide vane 308 are transformed based on the inclination parameter $\lambda_{IGV}$, and flow equations in the rotor 314 are transformed based on the inclination parameter $\lambda_{R1}$. Inserting the inclined variables into the Euler equations yields the following partial differential equation:

$$\frac{\partial}{\partial t'}(\hat{U} - \lambda \hat{G}) + \frac{\partial \hat{F}}{\partial x'} + \frac{\partial \hat{G}}{\partial y'} = 0, \quad \text{(Equation 6)}$$

where $\hat{U}$ is a conservative solution vector, and $\hat{G}$ and $\hat{F}$ are inviscid fluxes. The inclined variables can be used in a similar manner to transform the Navier-Stokes equations.

In modeling the system of FIG. 3, the transformed flow equations are iteratively solved across the computational grid at discrete time steps. A time step for the inlet guide vane 308 is different than a time step for the rotor 314. Thus, in the simulation, the rotor 314 is advanced at a time step that is different than that of the inlet guide vane 308 but related via the pitch-ratio between the rotor 314 and the inlet guide vane 308. Specifically, the time step for the rotor 314 is $$\Delta t_{R1} = \Delta t_{IGV} \frac{P_{IGV}}{P_{R1}}, \quad \text{(Equation 7)}$$

where $\Delta t_{IGV}$ is the time step for the inlet guide vane 308. The coupling between the inlet guide vane 308 and the rotor 314 is maintained via a transient rotor stator interface (TRS1) 310. The TRS1 interface 310 is described in greater detail in Bieseinger, et al., cited above, and is known to those of ordinary skill in the art.

Figure 4:
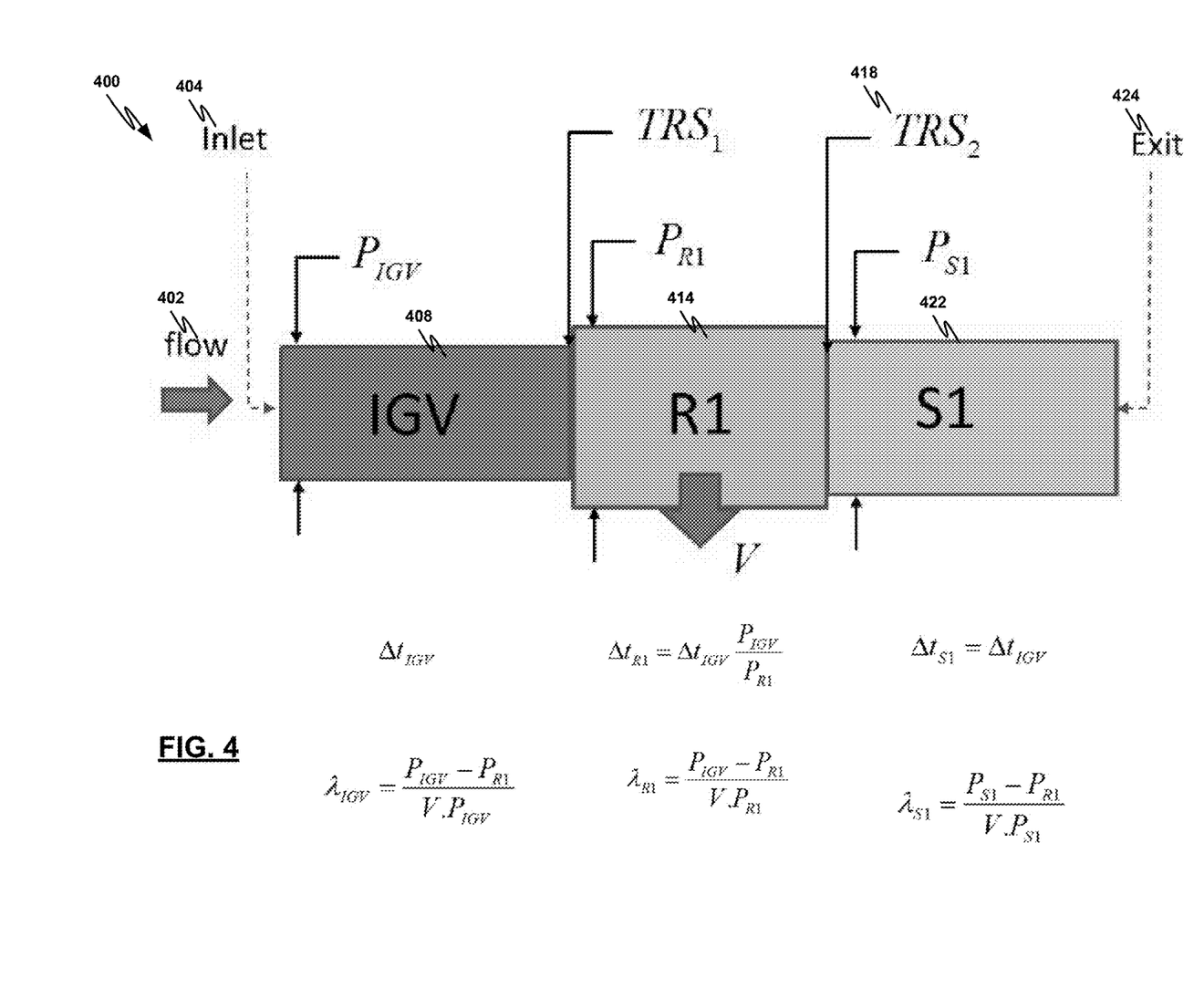
FIG. 4 is a block diagram depicting a 1.5 stage turbomachine including an inlet guide vane, a rotor, and a stator.

FIG. 4 is a block diagram 400 depicting a 1.5 stage turbomachine including an inlet guide vane 408, a rotor 414, and a stator 422. The block diagram 400 illustrates features of a physical system or structure to be analyzed via a computer-aided simulation, where the simulation is used to model various flow features of the system. As depicted in FIG. 4, the system to be analyzed includes an inlet 404 and an outlet 424, where a flow of fluid 402 enters the system via the inlet 404 and convects downstream, exiting the system via the outlet 424. In analyzing the system of FIG. 4, a specification of the system is received. The specification may define various features of the system, including geometry attributes of the system, and a computational grid is generated based on the received specification. Using the geometry attributes, a pitch value $P_{IGV}$ for the inlet guide vane 408, a pitch value $P_{R1}$ for the rotor 414, and a pitch value $P_{S1}$ for the stator 422 are calculated. A value V representing the rate of rotation of the rotor 414 is specified.

To model transient blade row interaction and capture trailing wakes in the 1.5 stage turbomachine using a single blade passage or a few blade passages per row, the pitch change between the inter-row blade passages is taken into account. The conventional time-transformation method described above with reference to FIG. 3 is capable of modeling blade row interaction in the first two rows (i.e., the inlet guide vane 408 and the rotor 414) with a single passage per row. Thus, FIG. 4 illustrates coupling between the inlet guide vane 408 and the rotor 414 via the TRS1 interface. The TRS1 interface is described above with reference to FIG. 3 and is used in implementing features of the conventional time-transformation method.

As noted above, however, the conventional time-transformation method is limited to modeling of single-stage turbomachines only. To extend the time-transformation method to facilitate modeling and analysis of flow features beyond the inlet guide vane 408 and the rotor 414 (e.g., tracking trailing wakes into the stator 422), the system and method described herein utilizes one or more single-sided time-transformation interfaces. Specifically, in the example of FIG. 4, to model flow features in the stator 422, a single-sided transient rotor stator (TRS2) interface 418 is used to couple the stator 422 with the rotor 414. The TRS2 interface 418 is said to be "single-sided" because the interface 418 transforms the governing flow equations in the stator 422 attached at the downstream side of the interface 418, and the interface 418 does not transform the governing flow equations in the rotor 414 that is attached at the upstream side of the interface 418. The downstream transformation is used to account for the signal pitch-change from the rotor 414 to the stator 422.

FIG. 4 illustrates a time step $\Delta t_{IGV}$ and inclination parameter $\lambda_{IGV}$ for the inlet guide vane 408, and further illustrates a time step $\Delta t_{R1}$ and inclination parameter $\lambda_1$ for the rotor 414. These time step and inclination values are the same as those from FIG. 3. Thus, the parameters $\lambda_{IGV}$ and $\lambda_{R1}$ are defined based on Equations 1 and 2, respectively, as they were for the single-stage system of FIG. 3, and the time step values $\Delta t_{IGV}$ and $\Delta t_{R1}$ also have not changed versus those provided for the system of FIG. 3.

An inclination parameter $\lambda_{S1}$ is used in transforming the governing flow equations in the stator 422, with the inclination parameter $\lambda_{S1}$ being defined by Equation 3. The transformation of the governing equations may be based on a set of transformed coordinates (e.g., x', y', z', t' for a 3D system) that utilize the inclination parameter $\lambda_{S1}$. A similar transformation is described above with reference to FIG. 3, and details of the transformation are not repeated here for brevity. As shown in Equation 3, the parameter $\lambda_{S1}$ is based on the value V representing the rate of rotation of the rotor 414 and the pitch difference between the rotor 414 and the stator 422. Additionally, the time step advancement $\Delta t_{S1}$ in the stator 422 is the same as that of the inlet guide vane 408 ($\Delta t_{IGV}$). Generally, if the row attached to the single-sided time-transformation interface is a stationary passage (i.e., a stator passage), then the passage will be advanced in time with a time-step that is the same as or similar to that of the inlet guide vane row.

Based on these parameters, an observer on the stator side of the TRS2 interface 418 senses the influence of the rotor 414 at the correct rotor passing frequency. However, an observer on the rotor side of the TRS2 interface 418 senses the influence of the stator 422 but not at the correct blade passing frequency. The single-sided transformation allows for blade trailing wakes to convect from upstream to downstream rows of the system 400 while accounting for the pitch difference between rows of the system 400.

Figure 5:
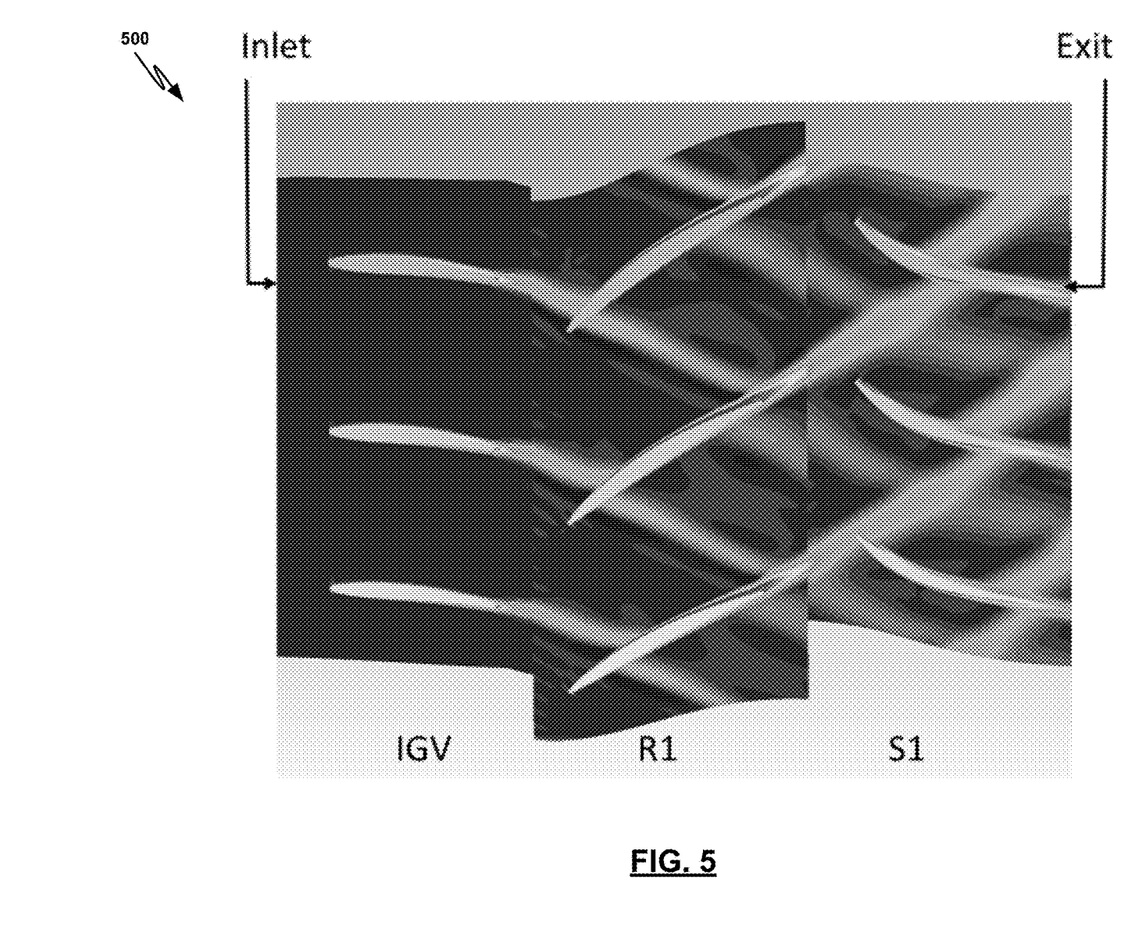
FIG. 5 depicts an output of an exemplary flow simulation for a 1.5 stage compressor.

FIG. 5 depicts an output of an exemplary flow simulation 500 for a 1.5 stage compressor. The flow simulation of FIG. 5 corresponds to a 1.5 stage modified Hannover compressor, where the flow of fluid enters the inlet of the inlet guide vane and convects downstream. The simulation is performed on a single passage per row, and FIG. 5 illustrates reconstruction of the solution on adjacent blade passages. A conventional time-transformation interface is used between the inlet guide vane and the rotor in the simulation, and a single-sided time-transformation interface (i.e., as described above with reference to FIG. 4) is used between the rotor and the stator. The output of the simulation depicts entropy contours showing trailing wakes from upstream rows convecting into downstream rows. It should be understood that the simulation output of FIG. 5 is exemplary only and that various other types of simulations may be performed using the systems and methods described herein.

Figure 6:
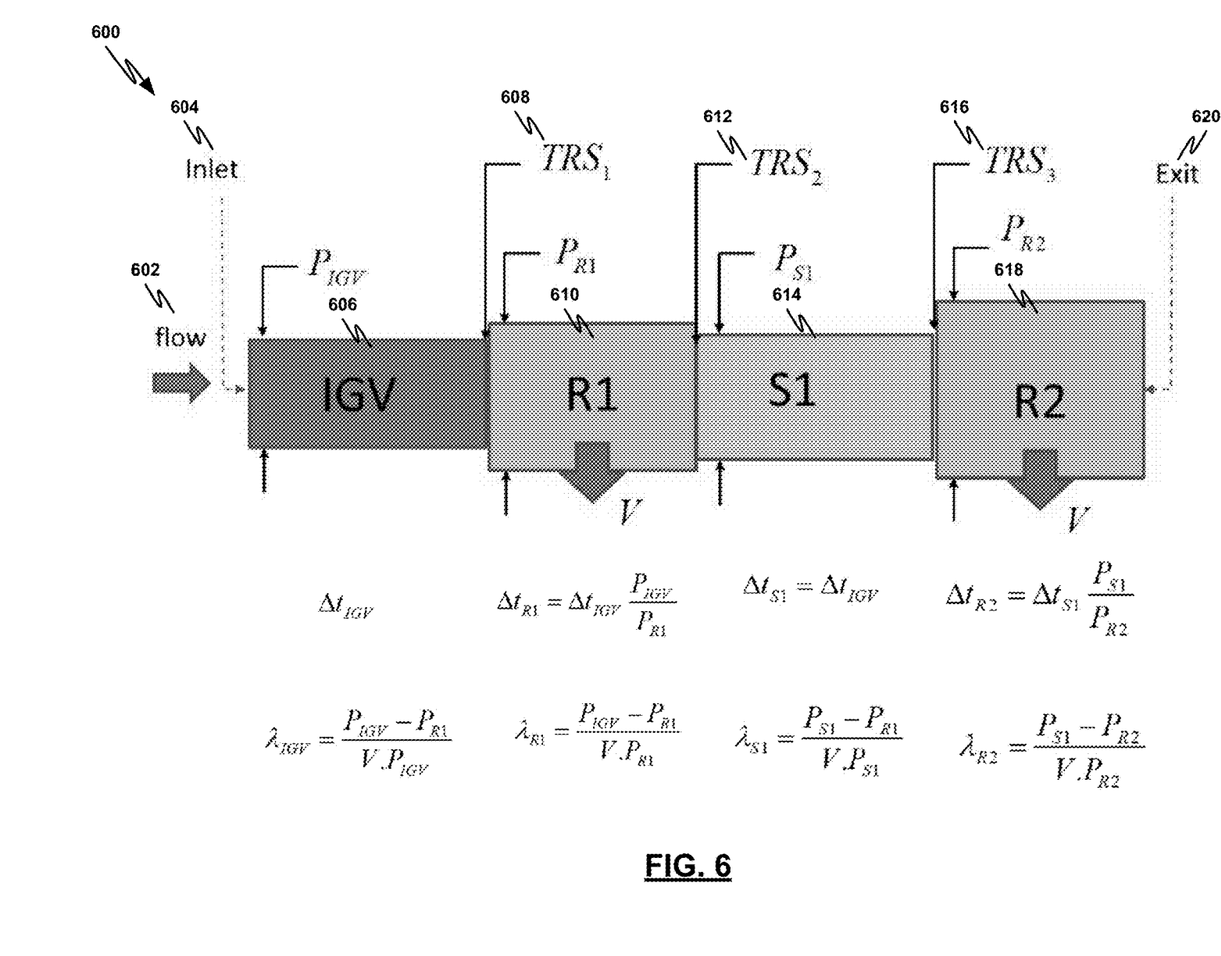
FIG. 6 is a block diagram depicting a two-stage turbomachine.

FIG. 6 is a block diagram 600 depicting a two-stage turbomachine. The two-stage turbomachine includes an inlet guide vane 606, a first rotor 610, a stator 614, and a second rotor 618. The block diagram 600 illustrates features of a physical system or structure to be analyzed via a computer-aided CFD simulation. As depicted in FIG. 6, the system to be analyzed includes an inlet 604 and an outlet 620, where a flow of fluid 602 enters the system via the inlet 604 and convects downstream, exiting the system via the outlet 620. In analyzing the system of FIG. 6, a specification of the system is received, and a computational grid is generated based on the received specification. The specification may define various features of the system, including geometry attributes of the system. Using the geometry attributes of the specification, a pitch value $P_{IGV}$ for the inlet guide vane 608, a pitch value $P_{R1}$ for the first rotor 610, a pitch value $P_{S1}$ for the stator 614, and a pitch value $P_{R2}$ for the second rotor 618 are calculated. A velocity value V representing the rate of rotation of the rotors 610, 618 is specified.

As described above with reference to FIG. 4, the conventional time-transformation method is capable of modeling blade row interaction in the first two rows (i.e., the inlet guide vane 608 and the first rotor 610) of a multistage system. These rows are coupled together via the TRS1 interface 608. To extend the conventional time-transformation method and facilitate modeling and analysis of the two-stage system of FIG. 6 (e.g., to track a trailing wake into the second rotor 618), the system and method described herein utilizes two single-sided time-transformation interfaces TRS2 and TRS3 612, 616. Specifically, in the example of FIG. 6, to model flow features in the stator 614, the single-sided TRS2 interface 612 is used to couple the stator 614 to the first rotor 610. For brevity, the description of the TRS2 interface 612 is not repeated here. To model flow features in the second rotor 618, the single-sided TRS3 interface 616 is used to couple the second rotor 618 to the stator 614. In this interface 616, only the governing flow equations in the second rotor 618 are transformed, and the governing flow equations in the stator 614 are not transformed based on the interface 616.

FIG. 6 illustrates time step and inclination parameters for each of the inlet guide vane 608, the first rotor 610, and the stator 614. The time step and inclination values are the same as those from FIG. 4. Thus, the parameters $\lambda_{IGV}$, $\lambda_{R1}$, and $\lambda_{S1}$ are defined based on Equations 1, 2, and 3, respectively, as they were for the system of FIG. 4, and the time step values $\Delta t_{IGV}$, $\Delta t_{R1}$, and $\Delta t_{S1}$ also have not changed versus those provided for the system of FIG. 4.

An inclination parameter $\lambda_2$ is used in transforming the governing flow equations in the second rotor 618, with the inclination parameter $\lambda_{R2}$ being defined by Equation 4. The transformation of the governing equations may be based on a set of transformed coordinates that utilize the inclination parameter $\lambda_{R2}$. A similar transformation is described above with reference to FIG. 3, and details of the transformation are not repeated here for brevity. As in previous examples, each of the passages 608, 610, 614, 618 has its own inclination parameter. The parameter $\lambda_{R2}$ defined by Equation 4 is based on the value V specifying the rate of rotation of the first and second rotors 610, 618 and the pitch difference between the stator 614 and the second rotor 618. The time step $\Delta t_{R2}$ for the second rotor 618 is related to the time step for the stator 614 by the pitch-ratio of the two passages:

$$\Delta t_{R2} = \Delta t_{S1} \frac{P_{S1}}{P_{R2}}, \quad \text{(Equation 8)}$$

Although the examples of FIGS. 1, 4, and 6 describe the modeling of multi-stage turbomachines having 1.5 and 2.0 stages, it should be understood that the system and method described herein can be extended to model systems of any arbitrary number of stages. If a passage to be added via a single-sided time-transformation interface is a stationary passage (i.e., a stator passage), then the passage will be advanced in time with a time step that is the same as or similar to that of the first row (i.e., the inlet guide vane). If the row to be added via a single-sided time-transformation interface is a rotating passage (i.e., a rotor passage), then the passage will be advanced in time with a time step proportional to the pitch ratio between the upstream stationary passage and the pitch of the rotor being added. Further, in adding a new passage via a single-sided time-transformation interface, the downstream passage attached to the interface will have its own inclination parameter used in the governing flow equation transformation, regardless of whether the new passage is a rotor passage or a stator passage. The inclination parameter for the attached passage is a function of (i) the difference between the pitches of the upstream and downstream passages attached to the single-sided time-transformation interface, and (ii) the rotation rate of the rotors included in the system (i.e., the circumferential velocity value V). Using the system and method described herein, any identifiable flow feature interacting between blade rows in any type of turbomachine (e.g., a single- or multiple-stage axial, radial, or mixed-flow turbomachine) may be modeled, including but not limited to flow features such as shocks, pressure variations, velocity profiles, and separated flow regions.

Figure 7:
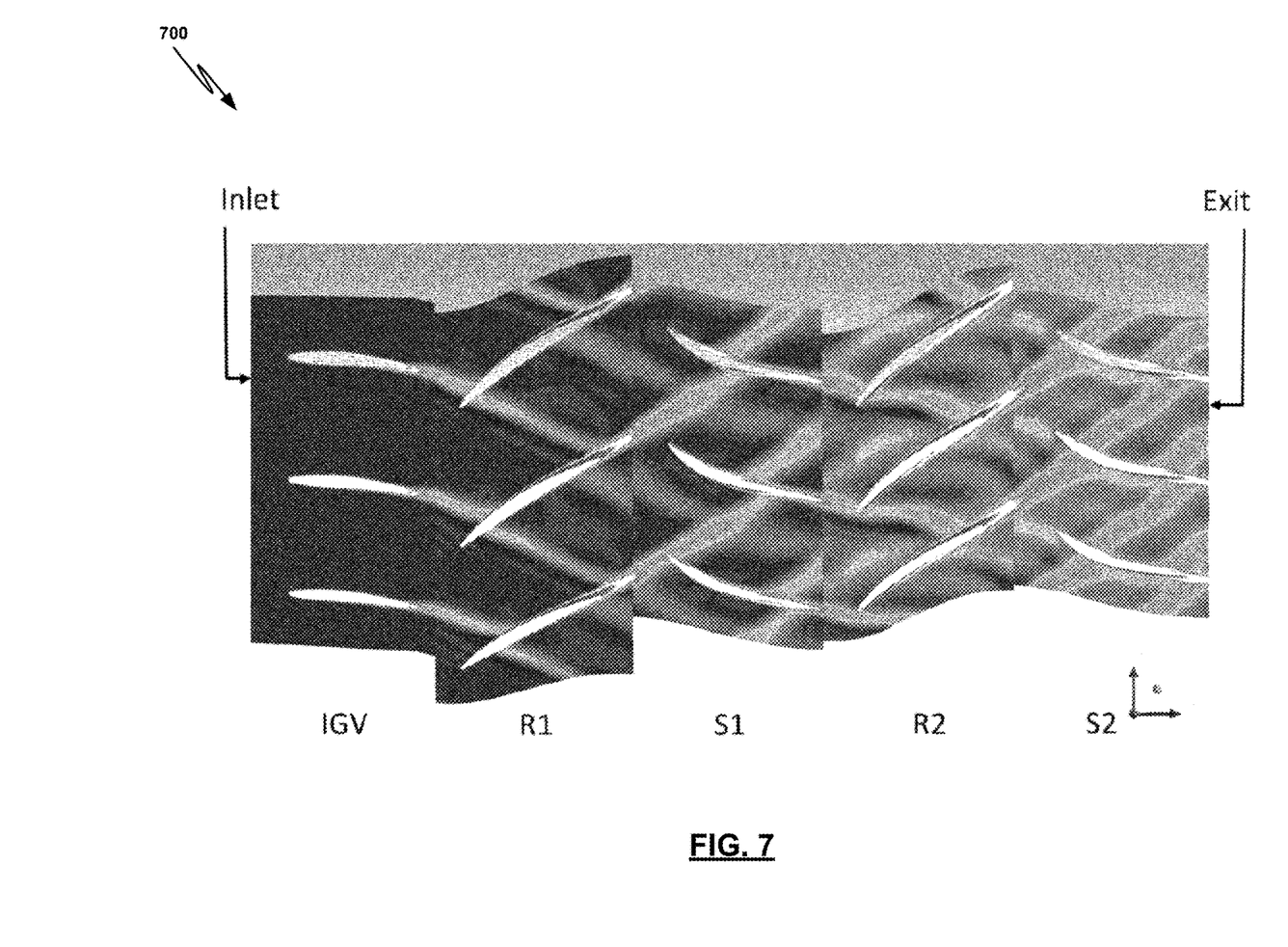
FIG. 7 depicts an output of an exemplary flow simulation for a 2.5 stage compressor.

FIG. 7 depicts an output of an exemplary flow simulation 700 for a 2.5 stage compressor. The flow simulation corresponds to a 2.5 stage modified Hannover compressor, where the flow of fluid enters the inlet of the inlet guide vane and convects downstream. The wakes from each blade row are shown to be captured and transmitted to downstream rows starting from the inlet guide vane. A conventional time-transformation interface is applied between the inlet guide vane and the first rotor in the simulation, while single-sided time-transformation interfaces are used between (i) the rotor R1 and the stator S1, (ii) the stator S1 and the rotor R2, and (iii) the rotor R2 and the stator S2. The output shown in FIG.

7 is the result of a transient rotor-stator (TRS) simulation that solves the flow on a single passage per row, and FIG. 7 illustrates reconstruction of the solution on neighboring blade passages.

Figure 8:
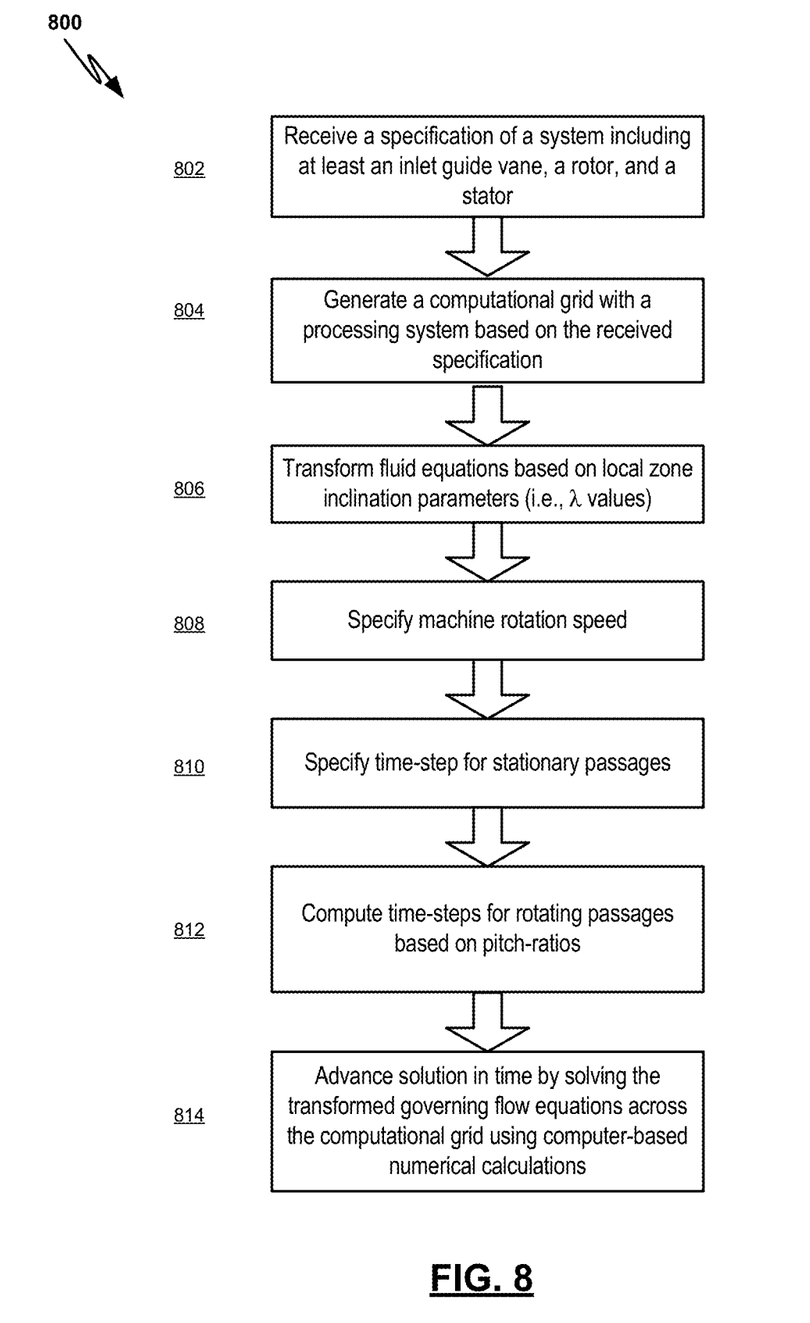
FIG. 8 is a flow diagram depicting example steps of computer-implemented method of modeling fluid flow between rows of blades in a turbomachine.

FIG. 8 is a flow diagram 800 depicting example steps of computer-implemented method of modeling fluid flow between rows of blades in a turbomachine. At 802, a specification of a system is received. The system includes multiple passages, where the multiple passages include at least an inlet guide vane, a rotor, and a stator. At 804, a computational grid is generated with a processing system based on the received specification. At 806, governing flow equations for the system are transformed based on local zone inclination parameters, where each passage of the system has an associated inclination parameter. At 808, a rotational velocity of rotating passages included in the system (i.e., a machine rotation speed) is specified, and at 810, a time-step for stationary passages included in the system is specified. At 812, time-steps for the rotating passages included in the system are computed, where the time-steps for the rotating passages are computed based on pitch-ratios for adjacent passages of the system. At 814, a solution for the system is advanced in time by solving the transformed governing flow equations across the computational grid using computer-based numerical calculations. The transformed governing equations are iteratively solved at discrete time steps defined by the time steps for the stationary passages and the rotating passages.

This written description uses examples to disclose the invention, including the best mode, and also to enable a person skilled in the art to make and use the invention. The patentable scope of the invention may include other examples. Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. A computer-implemented method of modeling fluid flow between rows of blades in a turbomachine, the method comprising:
   receiving a specification of a physical system including multiple passages, wherein the multiple passages include at least an inlet guide vane, a rotor, and a stator, each passage having an associated inclination parameter;
   generating a computational grid with a processing system based on the received specification;
   specifying a rotational velocity of rotating passages included in the physical system;
   specifying a time-step for stationary passages included in the physical system;
   computing time-steps for the rotating passages included in the physical system, wherein the time-steps for the rotating passages are computed based on pitch-ratios for adjacent passages of the physical system;
   generating an indication of an additional passage to the physical system at a downstream side of a single-sided time-transformation interface without transforming the flow equations for a passage of the physical system that is attached at an upstream side of the single-sided time-transformation interface; and
   advancing a solution for the physical system in time across the computational grid using computer-based numerical calculations, wherein governing flow equations are iteratively solved at discrete time steps defined by the time steps for the stationary passages and the rotating passages.

2. The computer-implemented method of claim 1, wherein based on a determination that the additional passage is a stationary passage, the additional passage uses a same time-step as the inlet guide vane.

3. The computer-implemented method of claim 1, wherein based on a determination that the additional passage is a rotating passage, the additional passage uses a time-step proportional to a pitch ratio between the passage attached at the upstream side of the single-sided time-transformation interface and the additional passage attached at the downstream side of the single-sided time-transformation interface.

4. The computer-implemented method of claim 1, wherein the additional passage is associated with the inclination parameter, and wherein the inclination parameter is based on (i) a pitch of the passage that is attached at the upstream side of the single-sided time-transformation interface, (ii) a pitch of the additional passage attached at the downstream side of the single-sided time-transformation interface, and (iii) the rotational velocity.

5. The computer-implemented method of claim 1, wherein the time step is the same for all of the stationary passages included in the physical system.

6. The computer-implemented method of claim 1, further comprising transforming of the governing flow equations based on the inclination parameters comprising:
    transforming flow equations for the inlet guide vane based on a parameter $\lambda_{IGV}$;
    transforming flow equations for the rotor based on a parameter $\lambda_{R1}$; and
    transforming flow equations for the stator based on a parameter $\lambda_{S1}$.

7. The computer-implemented method of claim 6, wherein the parameters $\lambda_{IGV}, \lambda_{R1}, \lambda_{S1}$ and are the inclination parameters used in transforming the governing flow equations in time.

8. The computer-implemented method of claim 6, wherein a coupling between the rotor and the stator is maintained via an interface, and wherein the interface is a single-sided time-transformation interface that transforms the flow equations for the downstream blade row without transforming the flow equations for the upstream blade row.

9. The computer-implemented method of claim 6, wherein the specification includes geometric attributes of the physical system, the method further comprising:
    calculating pitch values $P_{IGV}, P_{R1}, P_{S1}$ and associated with the inlet guide vane, the rotor, and the stator, respectively, based on the geometric attributes, wherein each of the pitch values specifies a pitch between adjacent blades of the associated inlet guide vane, rotor, or stator,
    wherein each of the parameters $\lambda_{IGV}$ and $I_{R1}$ is based on the rotational velocity and a difference between $P_{IGV}$ and $P_{R1}$, and
    wherein the parameter $\lambda_{S1}$ is based on the rotational velocity and a difference between $P_{S1}$ and $P_{R1}$.

10. The computer-implemented method of claim 9, wherein $$\lambda_{IGV} = \frac{P_{IGV} - P_{R1}}{VP_{IGV}},$$

$$\lambda_{R1} = \frac{P_{IGV} - P_{R1}}{VP_{R1}}, \text{ and}$$

$$\lambda_{S1} = \frac{P_{S1} - P_{R1}}{VP_{S1}},$$

where V represents the rotational velocity.

11. The computer-implemented method of claim 1, wherein the governing flow equations are Euler equations or Navier-Stokes equations.

12. The computer-implemented method of claim 1, wherein the multiple passages of the physical system include at least the inlet guide vane, the rotor, the stator, and a second rotor.

13. The computer-implemented method of claim 12, wherein the second rotor is coupled to the stator, and wherein the time step for the second rotor is $$\Delta t_{R2} = \Delta t_{S1} \frac{P_{S1}}{P_{R2}},$$

where $\Delta t_{R2}$ is the time step for the second rotor, $\Delta t_{S1}$ is the time step for the stationary passages of the physical system, $P_{S1}$ is a pitch value for the stator, and $P_{R2}$ is a pitch value for the second rotor.

14. The computer-implemented method of claim 12, further comprising the transforming of the governing flow equations based on the inclination parameters comprising:
    transforming flow equations for the inlet guide vane based on a parameter $\lambda_{IGV}$;
    transforming flow equations for the rotor based on a parameter $\lambda_{R1}$;
    transforming flow equations for the stator based on a parameter $\lambda_{S1}$; and
    transforming flow equations for the second rotor based on a parameter $\lambda_{R2}$.

15. The computer-implemented method of claim 14, wherein a coupling between the second rotor and the stator is maintained via an interface, and wherein the interface is a single-sided time-transformation interface that transforms the flow equations for the second rotor without transforming the flow equations for the stator.

16. The computer-implemented method of claim 14, wherein the specification includes geometric attributes of the physical system, the method further comprising:
    calculating pitch values $P_{IGV}, P_{R1}, P_{S1}$, and $P_{R2}$ associated with the inlet guide vane, the rotor, the stator, and the second rotor, respectively, based on the geometric attributes, wherein each of the pitch values specifies a pitch between adjacent blades of the associated inlet guide vane, rotor, or stator,
    wherein each of the parameters $\lambda_{IVG}$ and $I_{R1}$ is based on the rotational velocity and a difference between $P_{IGV}$ and $P_{R1}$,
    wherein the parameter $\lambda_{S1}$ is based on the rotational velocity and a difference between $P_{S1}$ and $P_{R1}$, and
    wherein the parameter $\lambda_{R2}$ is based on the rotational velocity and a difference between $P_{R2}$ and $P_{S1}$.

17. The computer-implemented method of claim 16, wherein $$\lambda_{R2} = \frac{P_{S1} - P_{R2}}{VP_{R2}}.$$

where V represents the rotational velocity.

18. A computer-implemented method of modeling fluid flow between rows of blades in a turbomachine, the method comprising:
    receiving a specification of a physical system including multiple passages, wherein the multiple passages include at least an inlet guide vane, a rotor coupled to the inlet guide vane, and a stator, each passage of the physical system having an associated inclination parameter;
    generating a computational grid with a processing system based on the received specification;
    specifying a rotational velocity of rotating passages included in the physical system;
    specifying a time-step for stationary passages included in the physical system;
    computing time-steps for the rotating passages included in the physical system, wherein the time-steps for the rotating passages are computed based on pitch-ratios for adjacent passages of the physical system, and the time step for the rotor is $$\Delta t_{R1} = \Delta t_{IGV} \frac{P_{IGV}}{P_{R1}},$$

where $\Delta t_{R1}$ is the time step for the rotor, $\Delta t_{IGV}$ is the time step for the stationary passages of the physical system, $P_{IGV}$ is a pitch value of the inlet guide vane, and $P_{R1}$ is a pitch value of the rotor; and advancing a solution for the physical system in time across the computational grid using computer-based numerical calculations, wherein governing equations are iteratively solved at discrete time steps defined by the time steps for the stationary passages and the rotating passages.

19. A system for modeling fluid flow between rows of blades in a turbomachine, the system comprising:

a processing system; and a memory in communication with the processing system, wherein the processing system is configured to execute steps comprising:

receiving a specification of a physical system including multiple passages, wherein the multiple passages include at least an inlet guide vane, a rotor, and a stator, each passage of the physical system having an associated inclination parameter;

generating a computational grid with a processing system based on the received specification;

specifying a rotational velocity of rotating passages included in the physical system;

specifying a time-step for stationary passages included in the physical system;

computing time-steps for the rotating passages included in the physical system, wherein the time-steps for the rotating passages are computed based on pitch-ratios for adjacent passages of the physical system;

generating an indication of an additional passage to the physical system at a downstream side of single-sided time-transformation interface without transforming the flow equations for a passage of the physical system that is attached at an upstream side of the single-sided time-transformation interface; and advancing a solution for the physical system in time across the computational grid using computer-based numerical calculations, wherein governing flow equations are iteratively solved at discrete time steps defined by the time steps for the stationary passages and the rotating passages.

20. A non-transitory computer-readable storage medium for modeling fluid flow between rows of blades in a turbomachine, the computer-readable storage medium comprising computer-executable instructions which, when executed, cause a processing system to execute steps comprising:

receiving a specification of a physical system including multiple passages, wherein the multiple passages include at least an inlet guide vane, a rotor, and a stator, each passage of the physical system having an associated inclination parameter;

generating a computational grid with a processing system based on the received specification;

specifying a rotational velocity of rotating passages included in the physical system;

specifying a time-step for stationary passages included in the physical system;

computing time-steps for the rotating passages included in the physical system, wherein the time-steps for the rotating passages are computed based on pitch-ratios for adjacent passages of the physical system;

generating an indication of an additional passage to the physical system at a downstream side of the single-sided time-transformation interface without transforming the flow equations for a passage of the physical system that is attached at an upstream side of the single-sided time-transformation interface; and advancing a solution for the physical system in time across the computational grid using computer-based numerical calculations, wherein governing flow equations are iteratively solved at discrete time steps defined by the time steps for the stationary passages and the rotating passages.

\* \* \* \* \*